(12) United States Patent
Piazza

(10) Patent No.: US 6,800,515 B2
(45) Date of Patent: Oct. 5, 2004

(54) DRAM AND MOS TRANSISTOR MANUFACTURING

(75) Inventor: Marc Piazza, Pontcharra (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/304,580

(22) Filed: Nov. 26, 2002

(65) Prior Publication Data

US 2003/0100179 A1 May 29, 2003

(30) Foreign Application Priority Data

Nov. 28, 2001 (FR) .............................................. 01 15362

(51) Int. Cl.[7] .................. H01L 21/336; H01L 21/8242; H01L 21/20; H01L 29/76; H01L 29/74
(52) U.S. Cl. ..................... 438/197; 438/239; 438/254; 438/381; 438/396; 438/399; 257/296; 257/308
(58) Field of Search ................................ 438/239, 254, 438/238, 253, 255, 256, 381, 396, 397, 398, 241, 242, 243, 197; 257/307

(56) References Cited

U.S. PATENT DOCUMENTS

| | | | | |
|---|---|---|---|---|
| 4,837,176 A | * | 6/1989 | Zdebel et al. ................ | 438/552 |
| 5,338,700 A | | 8/1994 | Dennison et al. | |
| 5,858,831 A | * | 1/1999 | Sung .......................... | 438/241 |
| 5,874,756 A | | 2/1999 | Ema et al. | |
| 5,893,734 A | * | 4/1999 | Jeng et al. ................... | 438/239 |
| 5,918,120 A | * | 6/1999 | Huang ........................ | 438/239 |
| 6,008,084 A | * | 12/1999 | Sung .......................... | 438/241 |
| 6,200,855 B1 | * | 3/2001 | Lee ............................. | 438/255 |
| 6,235,620 B1 | * | 5/2001 | Saito et al. .................. | 438/586 |
| 6,255,161 B1 | * | 7/2001 | Lin ............................. | 438/254 |
| 6,294,426 B1 | * | 9/2001 | Tu et al. ...................... | 438/255 |
| 6,384,441 B1 | * | 5/2002 | Sugiyama et al. .......... | 257/296 |
| 6,432,771 B1 | | 8/2002 | Ciavatti | |
| 6,436,763 B1 | * | 8/2002 | Huang et al. ................ | 438/255 |
| 6,541,333 B2 | * | 4/2003 | Shukuri et al. ............. | 438/243 |
| 2003/0049903 A1 | * | 3/2003 | Mitani ........................ | 438/253 |
| 2003/0087499 A1 | * | 5/2003 | Lane et al. .................. | 438/396 |

FOREIGN PATENT DOCUMENTS

EP 1 037 265 A 9/2000

OTHER PUBLICATIONS

French Search Report from French Patent Application No. 01/15362, filed Nov. 28, 2001.

* cited by examiner

Primary Examiner—Matthew Smith
Assistant Examiner—Chuong A Luu
(74) Attorney, Agent, or Firm—Lisa K. Jorgenson; William R. McClellan; Wolf, Greenfield & Sacks P.C.

(57) ABSTRACT

A method for manufacturing DRAM cells in a semiconductor wafer including MOS control transistors and capacitors, the source/drain regions and the gates of the control transistors being covered with a protection layer and with an insulating layer, in which the capacitors are formed at the level of openings formed in the insulating layer which extend to the protection layer covering the gates, and in which first capacitor electrodes are connected to source/drain regions of the control transistors by conductive vias crossing the insulating layer and the protection layer.

15 Claims, 5 Drawing Sheets

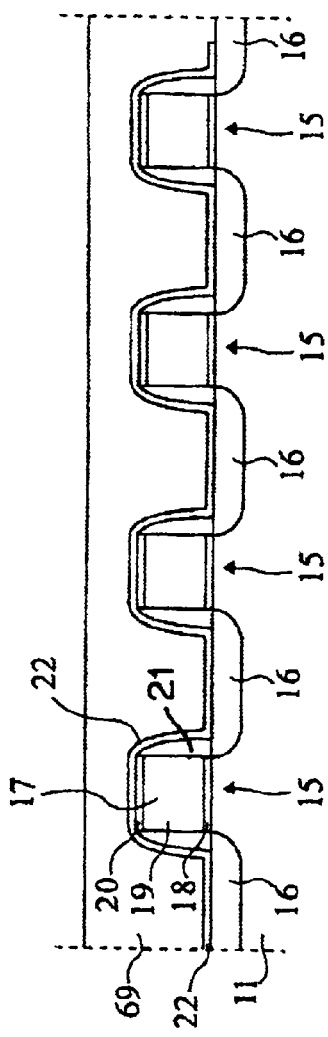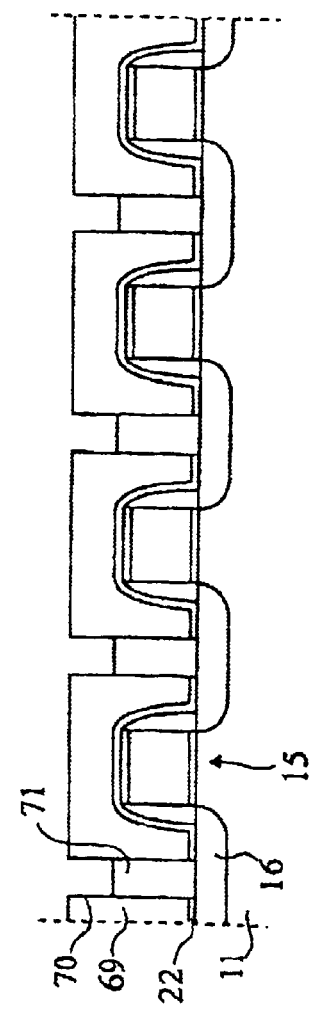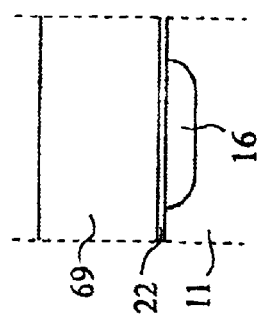

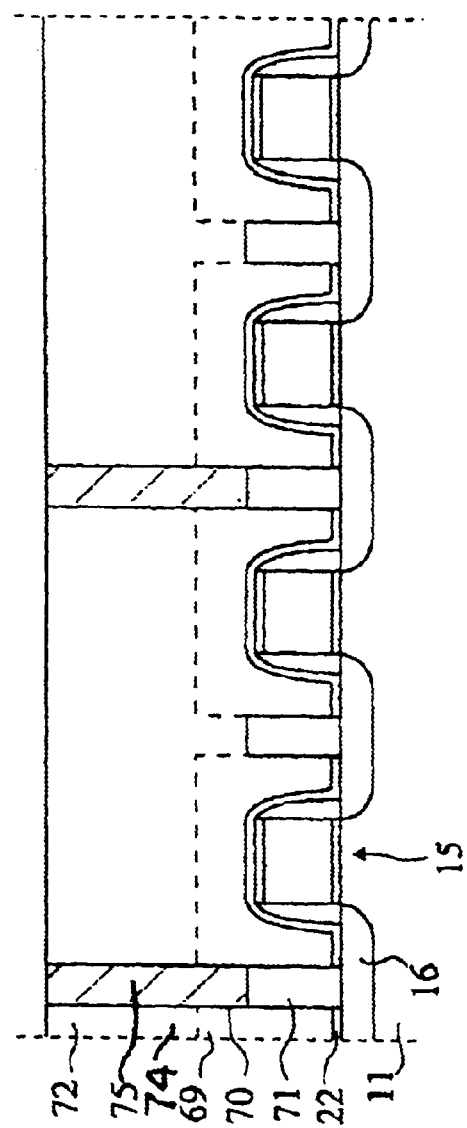
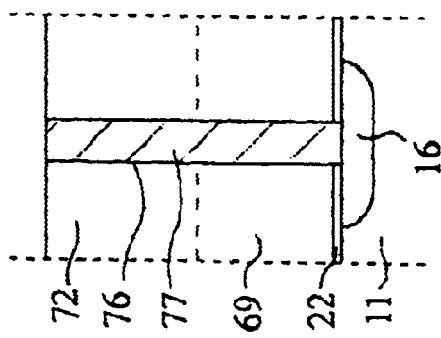
Fig 5

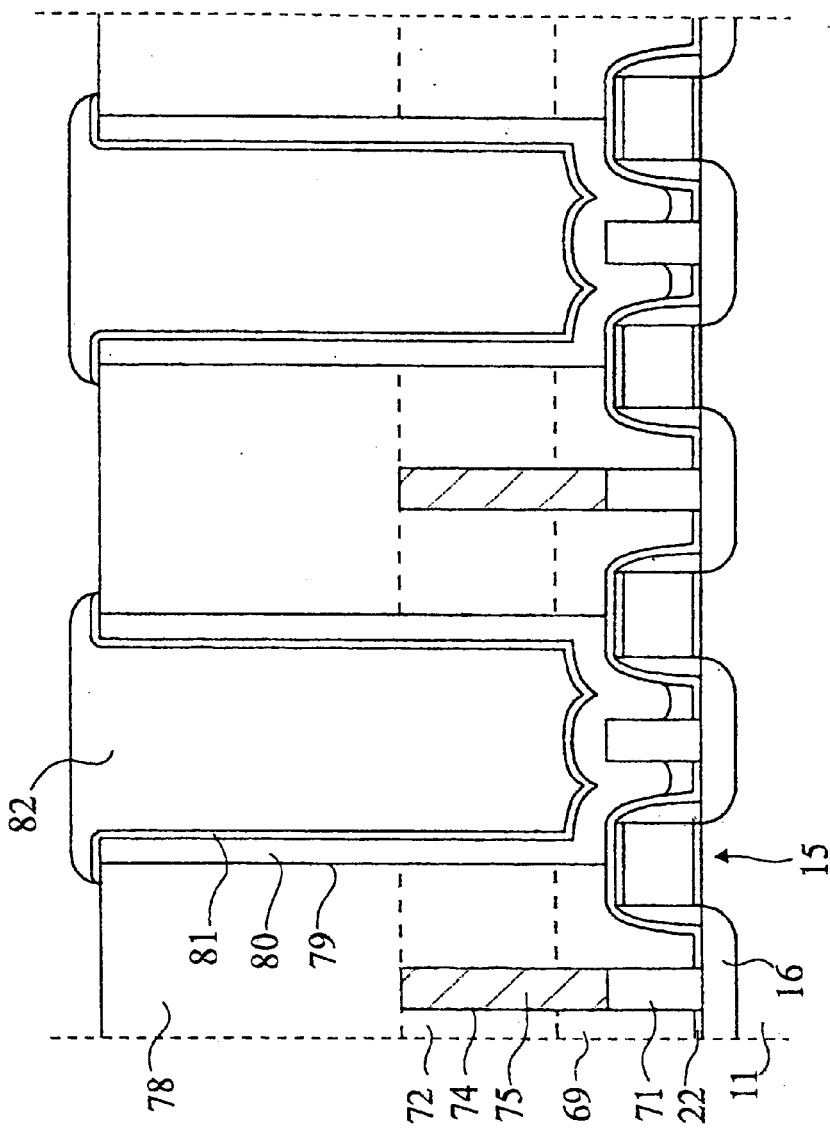
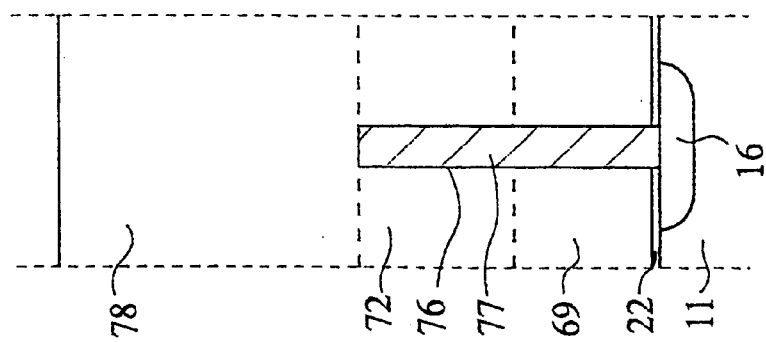
Fig 6

DRAM AND MOS TRANSISTOR MANUFACTURING

BACKGROUND OF THE INVENTION

1. Field of the Invention

The present invention relates to the manufacturing in monolithic form of DRAM cells. More specifically, the present invention relates to the manufacturing on the same semiconductor wafer of DRAM cells and of MOS transistors according to a process compatible with a standard CMOS process.

2. Discussion of the Related Art

FIG. 1 shows an example of a wafer structure on which are formed DRAM cells and MOS transistors according to a conventional CMOS process. DRAM cells (a single cell being formed), each of which is formed of a MOS control transistor and of a capacitor, a first electrode of the capacitor being in contact with the drain or source region of the transistor, are formed to the right of FIG. 1, on a first portion of a semiconductor substrate 11. On a second portion of substrate 11, to the left of the drawing, logic circuits including MOS transistors are formed. Hereafter, the first and second portions will be called the memory side and the logic side. It should be noted that "substrate" designates the actual substrate as well the wells and/or doped regions formed therein. It should also be noted that, on the logic side, no MOS transistor gates have been formed.

The manufacturing method of this conventional structure is the following. The MOS transistors 15 on the memory side and on the logic side are first formed. Each MOS transistor 15 includes doped source and drain regions 16 and an associated gate 17. Each gate 17 is formed of a multiple-layer: a gate insulator 18 in contact with semiconductor substrate 11, a polysilicon layer 19, and a conductive layer 20, for example, $CoSi_2$ (connected to a gate, not shown). Spacers 21, for example, $Si_3N_4$, are arranged on either side of gate 17. The gate structure is optimized mainly with a view to the desired properties of the transistors located on the logic side.

A protection layer 22, for example, silicon oxynitride (SiON), is deposited on the structure thus obtained. A first insulating layer 23 is then deposited on the memory side and on the logic side. First vias 25, for example, made of tungsten, which cross first insulating layer 23 and protection layer 22 to contact source or drain regions 16, are formed on the memory side and on the logic side.

A second insulating layer 26 is then deposited on the memory side and on the logic side.

On the memory side, openings 30 having a width substantially corresponding to the pitch of the gates crossing second insulating layer 26 are etched to expose the upper ends of first vias 25 not connected to second vias 35.

The capacitors are then formed. The walls of openings 30 are covered with a first conductive material 31 which forms the first capacitor electrode. A dielectric 32 covers first conductive material 31 and forms the second capacitor electrode. A second conductive material 33 covers dielectric 32 and forms the second capacitor electrode.

A third insulating layer 34 is deposited on the memory side and on the logic side. Second vias 35, for example, made of tungsten, which cross the second and third insulating layers 26, 34 to join, on the logic side, all first vias 25, and to join, on the memory side, some of first vias 25, are formed on the memory side and on the logic side. Vias 36 which cross third insulating layer 34 to contact second conductive material 33 of the capacitors are also formed.

Contacts 37 of vias 35, on the logic side, and contacts of vias 35 and 36, on the memory side, are finally formed in third insulating layer 34.

Second vias 35, for example, made of tungsten, which cross second insulating layer 26 to join, on the logic side, all first vias 25, and to join, on the memory side, some of first vias 25, are formed on the memory side and on the logic side.

For such a structure, the spacing between transistors being mainly imposed by the CMOS process being used, the dimensions of the capacitors and thus their capacitance, are a direct function of the thickness of second insulating layer 26. To increase the capacitance of the capacitors, it could be attempted to increase the thickness of second insulating layer 26.

However, this increase is necessarily limited. Indeed, generally, it is desired to form vias having the smallest possible diameter, and those skilled in the art know that the forming of vias of small diameter in an insulating layer of high thickness is difficult. Indeed, it is difficult to fill an opening of small diameter with a conductive material to ensure a satisfactory electric connection. The ratio between the thickness of the insulating layer and the diameter of the opening in which the via must be formed is called the aspect ratio. The higher this ratio, the more difficult is the realization of the via. For vias having a 200-nm diameter, according to current technologies, maximum aspect ratios on the order of 9 may be reached, which limits the thickness of the second layer to values on the order of 1800 nm.

Thus, the DRAM manufacturing method using gate structures and metal vias compatible with a conventional CMOS technology imposes a limit to the increase in the capacitance of memory cell capacitors.

FIG. 2 shows an example of a DRAM cell structure formed in a semiconductor wafer by a method aiming at optimizing the manufacturing of these cells, possibly to the detriment of simultaneously-formed CMOS logic circuits.

The method for manufacturing such a memory cell is the following. MOS transistors 51 including source and drain regions 52 formed in a semiconductor substrate 53 are first formed. The gates associated with MOS transistors 51 are formed of a multiple layer formed of a gate insulator 54, of a polysilicon layer 55, of a conductive layer, for example, tungsten silicide ($WSi_x$) 56, and of an insulating layer, for example, $Si_3N_4$, 57. Spacers 58, for example, $Si_3N_4$, are formed on either side of the gate.

Then, a protection layer 59, for example, SiON, and an insulating layer 60, are deposited over the entire structure.

Insulating layer 60 and protection layer 59 are etched to form openings 61 exposing source and drain regions 52, the etch stop being obtained by spacers 58 and $Si_3N_4$ insulating layer 57. The capacitor is then formed.

The capacitors are finally formed, conventionally, in openings 61. The walls of openings 61 are covered with a first conductive material 62 which forms the first capacitor electrode. A dielectric 63 covers first conductive material 62. A second conductive material 64 covers dielectric 63 and forms the second capacitor electrode.

Such a capacitor structure, for which the capacitor extends over the entire thickness of insulating layer 60, enables making the facing surface area between the two capacitor electrodes maximum. It is an optimal structure to obtain a capacitor of maximum capacitance.

It is however not possible to reproduce this structure when memory cells and MOS transistors are desired to be formed on the same wafer according to a conventional CMOS process.

Indeed, in the case of a manufacturing on a same wafer of DRAM cells and of MOS transistors, an optimal structure for the MOS transistors located on the logic side is generally chosen, this structure being reproduced for the memory cell control transistors. As a result, the transistor structure may not be optimal for the memory cells. Thus, it appears that the multiple-layer forming gate 17 of a MOS transistor of FIG. 1 has a structure different from that of the gate of a MOS transistor of FIG. 2. Indeed, in FIG. 1, polysilicon layer 19 is only covered with a conductive layer 20, while in FIG. 2, polysilicon layer 55 is covered with a conductive layer 56 and with an $Si_3N_4$ insulating layer 57. The gates further are, on both drawings, covered with a protection layer 22, 59, for example, SiON.

Accordingly, with the transistor structure of FIG. 1, if the openings in which the capacitors will be formed are etched to reach the level of the MOS transistor gates, protection layer 22 covering the gates will be etched. In the capacitor forming, short-circuits will be obtained between the conductive material of the capacitors and the upper conductive layers of the gates.

SUMMARY OF THE INVENTION

The present invention accordingly aims at providing a novel manufacturing method of DRAM cells and MOS transistors in a same integrated circuit wafer enabling obtaining an optimal capacitor capacitance while remaining compatible with standard transistor gate structures.

The present invention also aims at providing a method for forming vias having an improved aspect ratio.

To achieve these and other objects, the present invention provides a method for manufacturing, in a first region of a semiconductor wafer, DRAM cells each including a MOS control transistor and a capacitor and, in a second region of the wafer, MOS transistors, the first and second regions being covered with a protection layer and with a first insulating layer, including the steps of etching at the level of the first region first openings to expose the source or drain regions of the control transistors; filling the first openings with a first conductive material; re-etching the first conductive material down to part of the depth of the first openings; depositing at the level of the first and second regions a second insulating layer; etching at the level of the first region second openings and at the level of the second region third openings exposing source or drain regions of the transistors; and filling the second and third openings with a second conductive material; depositing at the level of the first and second regions a third insulating layer; etching at the level of the first region fourth openings exposing the first conductive material of the first openings, and extending over gates of adjacent control transistors; forming the capacitors at the level of the fourth openings; and etching at the level of the first and second regions fifth openings respectively joining the second openings and the third openings; and filling the fifth openings of the second conductive material to form vias.

According to another embodiment of the present invention, the protection layer covering the gates of the control transistors forms an etch stop upon etching of the fourth openings.

According to another embodiment of the present invention, the second openings expose the first conductive material of first openings.

According to another embodiment of the present invention, the second openings expose source or drain regions of the control transistors.

According to another embodiment of the present invention, the capacitor is formed by covering the walls and the bottom of the fourth openings with a third conductive material forming the first capacitor electrode, then depositing a dielectric material forming a capacitor insulator, and depositing a fourth conductive material forming a second capacitor electrode.

According to another embodiment of the present invention, the first conductive material is polysilicon.

According to another embodiment of the present invention, the second conductive material is a metal or a metal nitride.

According to another embodiment of the present invention, the protection layer is a multiple-layer.

According to another embodiment of the present invention, the protection layer includes $Si_3N_4$.

The foregoing embodiments, features and advantages of the present invention will be discussed in detail in the following non-limiting description of specific embodiments in connection with the accompanying drawings.

BRIEF DESCRIPTION OF THE DRAWINGS

FIGS. 3 to 7 show cross-section views of a same integrated circuit wafer at different successive steps of its manufacturing according to an embodiment of the present invention.

DETAILED DESCRIPTION

For clarity, same elements have been designated with the same references in the different drawings and, further, as usual in the representation of integrated circuits, the different drawings are not to scale.

An embodiment of the present invention will be discussed hereafter in relation with FIGS. 3 to 7.

Figure 1:
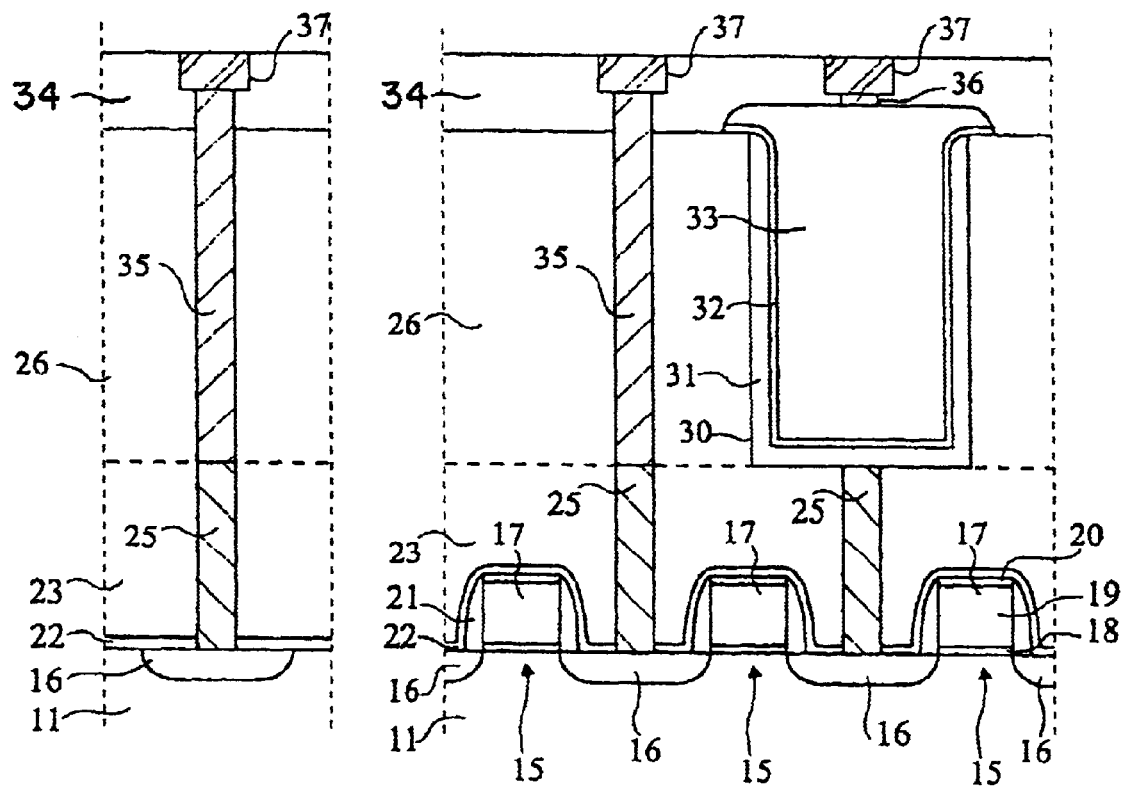
FIG. 1, previously described, shows a cross-section view of a monolithic circuit including DRAM cells and MOS transistors formed according to a conventional CMOS technology.
Figure 2:
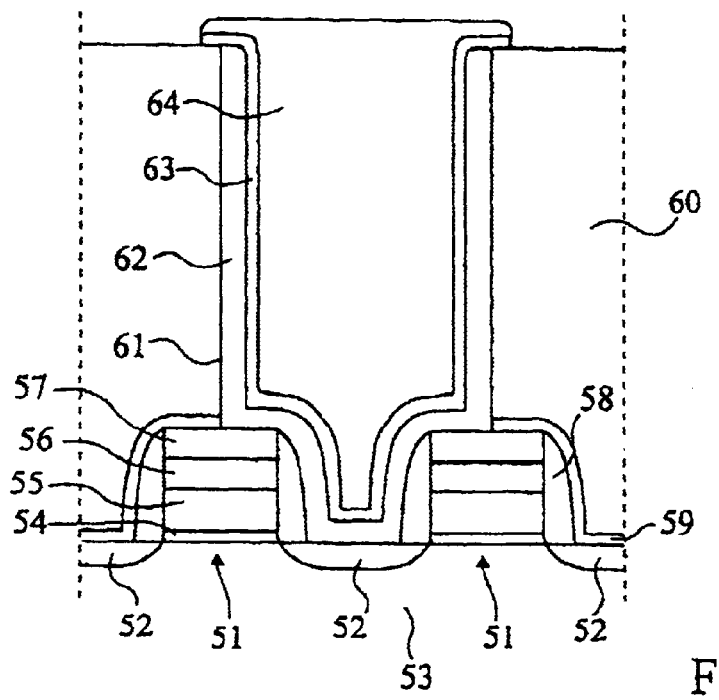
FIG. 2, previously described, shows a monolithic circuit including DRAM cells formed according to a conventional technology.

As for FIG. 1, DRAM cells are desired to be formed, to the right of the drawings, on a first portion of a semiconductor substrate 11, typically made of silicon. On a second portion of substrate 11, to the left of the drawings, logic circuits including MOS transistors are desired to be formed. Hereafter, the first and second portions will be called the memory side and the logic side.

As appears in FIG. 3, on the memory side and on the logic side, source and drain regions 16 of MOS transistors 15 as well as the associated gates 17 have been formed. On the logic side, the gates of MOS transistors have not been shown. Each gate 17 is conventionally formed of a multiple-layer of: a gate insulator 18 in contact with semiconductor substrate 11, a polysilicon layer 19, and a conductive layer 20, for example, $CoSi_2$. Spacers 21, for example, made of $Si_3N_4$, are arranged on either side of gate 17. The gate structure is optimized mainly with a view to the properties desired for the transistors located on the logic side. The absence of a specific insulating layer, for example, made of $Si_3N_4$, at the top of the gate multiple-layer, should particularly be noted.

A protection layer 22 and a first insulating layer 69, for example, silicon oxide, are successively deposited, on the memory side and on the logic side, on the entire obtained structure. Protection layer 22 may be a multiple-layer or a silicon oxynitride.

As shown in FIG. 4, first openings 70 are etched, on the memory side, in first insulating layer 69 and protection layer 22 to expose source and drain regions 16. A semiconductor material 71, for example, polysilicon, is deposited in first openings 70. The polysilicon deposition is then planarized, for example, by a conventional chem-mech planarization method. The polysilicon deposition is then etched in first openings 70 to form first portions of polysilicon vias 71 having a thickness smaller than that of first insulating layer 69.

As shown in FIG. 5, a second insulating layer 72 is deposited on the memory side and on the logic side, over the entire integrated circuit wafer. On the memory side, second openings 74 which join some of first openings 70 are etched in second insulating layer 72. On the logic side, third openings 76 which cross first and second insulating layer 69, 72 and protection layer 22 are etched in second insulating layer 72 to expose source and drain regions 16. A conductive material, for example, titanium, tungsten, or TiN, is then deposited in openings 76 to form third via portions 77. On the memory side, a conductive material, for example, titanium, tungsten, or TiN, is simultaneously deposited in openings 74, to obtain second via portions 75 continuing first via portions 71. As an example, first and second insulating layers 69, 72 have respective thicknesses on the order of 650 nm and 550 nm.

As shown in FIG. 6, a third insulating layer 78 is deposited, on the memory side and on the logic side, on the integrated circuit wafer. As an example, the thickness of third insulating layer 78 is on the order of 1200 nm. Fourth openings 79 which cross the first, second, and third insulating layers 69, 72, 78 and which substantially stop on protection layer 22 to expose some of the first polysilicon via portions 71 are then etched in third insulating layer 78. Openings 79 have greater dimensions than the dimensions of openings 74 and 70. In particular, each fourth opening 79 laterally extends on two neighboring gates. It should be noted that it is possible for fourth opening 79 not to be etched to the level of substrate 11, and for a portion of first insulating layer 69 to remain between the bottom of fourth opening 79 and substrate 11, when a portion of polysilicon via 71 is exposed.

Capacitors are conventionally formed in fourth openings 79 by the successive deposition of a first conductive material 80 forming the first capacitor electrode, of a dielectric 81, and of a second conductive material 82 forming the second capacitor electrode.

Figure 7:
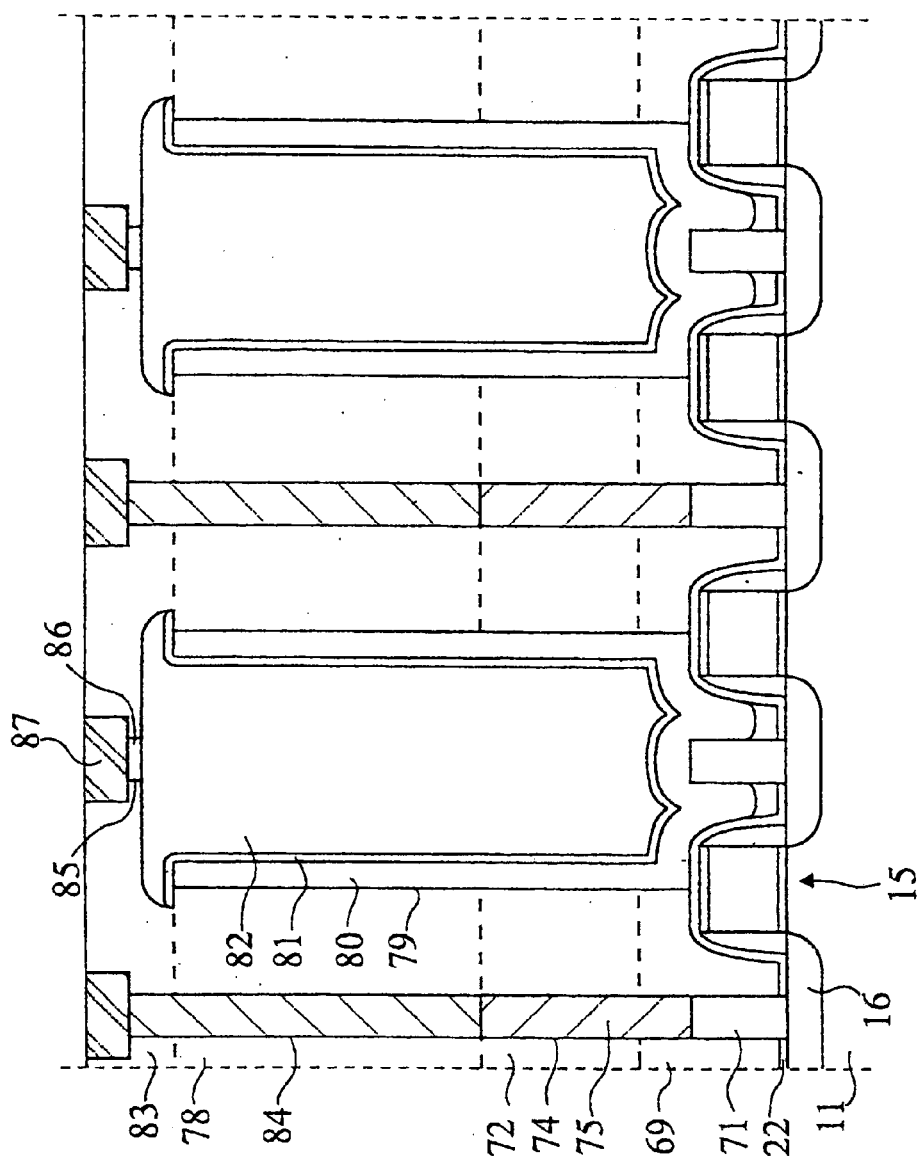

As shown in FIG. 7, a fourth insulating layer 83 is deposited, on the logic side and on the memory side, on third insulating layer 78, having a thickness, as an example, on the order of 200 nm. Fifth openings 84 which cross the fourth and third insulating layers 89, 78 are etched to join, on the logic side, third openings 76, and on the memory side, some of second openings 74. A conductive material, for example, titanium, tungsten, or TiN, is deposited in fifth openings 84 to continue, on the memory side, second via portions 75, and on the logic side, third via portions 77. On the memory side, openings 85 exposing the top of the second electrode of the capacitors in which a conductive material is deposited to form a via are etched. Finally, on the memory side and on the logic side, contact lines 87, for example, made of copper, are formed in trenches which connect the ends of each of the vias.

According to an alternative of the present invention, at the steps shown in FIG. 4, openings 70, and thus via portions 71 are only formed on the memory side on source and drain regions 16 which are desired to be connected to a capacitor electrode. In this case, at the steps shown in FIG. 5, openings 76 which, on the logic side, expose source and drain regions 16 and which, on the memory side, expose source and drain regions 16 which are not connected to first via portions 71, are formed. The other steps remain unchanged.

The present invention has many advantages.

First, the opening in which the capacitor is formed is etched through first, second, and third insulating layers substantially to the protection layer covering the monolithic circuit substrate. The facing surface area between the capacitor electrodes, and accordingly, its capacitance, are thus increased.

Second, the transistor gate manufacturing method is not modified with respect to a conventional CMOS process.

Third, the fact that the sum of the thicknesses of the first and second insulating layers is substantially equal to the thickness of the third insulating layer eases the forming of the vias on the memory side and on the logic side. In a conventional method according to a CMOS technology, the thickness of the single insulating layer in which the capacitor is formed is generally as large as possible to obtain satisfactory capacitor capacitances while taking into account the feasibility of the vias to be formed in the layer. These vias then have the maximum aspect ratio allowed by the technology used. Conversely, the method according to the present invention enables reducing the aspect ratio for each via portion while enabling obtaining capacitors of increased capacitance. Indeed, according to the present method, the capacitor is formed in the first, second, and third insulating layers, enabling balanced distribution of the thicknesses of the insulating layers, and thus reduction of the aspect ratios of the via portions in each insulating layer.

Of course, the present invention is likely to have various alterations, modifications, and improvements which will readily occur to those skilled in the art. In particular, some steps may be adapted by those skilled in the art. For example, the openings formed by a single etch step in the third and fourth insulating layer may be obtained in two distinct etch steps. Further, the protection layer, as well as the insulating layers, may consist in a multiple-layer formed of several layers.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for manufacturing, in a first region of a semiconductor wafer, DRAM cells each including a MOS control transistor and a capacitor and, in a second region of the wafer, MOS transistors, the first and second regions being covered with a protection layer and with a first insulating layer, including the steps of:

etching at the level of the first region first openings to expose the source or drain regions of the control transistors; filling the first openings with a first conductive material; re-etching the first conductive material down to part of the depth of the first openings;

depositing at the level of the first and second regions a second insulating layer; etching at the level of the first region second openings and at the level of the second region third openings exposing source or drain regions of the transistors; and filling the second and third openings with a second conductive material;

depositing at the level of the first and second regions a third insulating layer; etching at the level of the first region fourth openings exposing the first conductive material of the first openings, and extending over gates of adjacent control transistors; forming the capacitors at the level of the fourth openings; and etching at the level of the first and second regions fifth openings respectively joining the second openings and the third openings; and filling the fifth openings of the second conductive material to form vias.

2. The method of claim 1, wherein the protection layer covering the gates of the control transistors forms an etch stop upon etching of the fourth openings.

3. The method of claim 1, wherein the second openings expose the first conductive material of first openings.

4. The method of claim 1, wherein the second openings expose source or drain regions of the control transistors.

5. The method of claim 1, wherein the capacitor is formed by covering the walls and the bottom of the fourth openings with a third conductive material forming the first capacitor electrode, then depositing a dielectric material forming a capacitor insulator, and depositing a fourth conductive material forming a second capacitor electrode.

6. The method of claim 1, wherein the first conductive material is polysilicon.

7. The method of claim 1, wherein the second conductive material is a metal or a metal nitride.

8. The method of claim 1, wherein the protection layer is a multiple-layer.

9. The method of claim 1, wherein the protection layer includes $Si_3N_4$.

10. A method for manufacturing, in a first region of a semiconductor wafer, DRAM cells each including an MOS control transistor and a capacitor and, in a second region of the semiconductor wafer, MOS transistors, comprising:

depositing, in the first and second regions, a protective layer and a first insulating layer;

etching, in the first region, first openings to expose source or drain regions of the MOS control transistors, filling the first openings with a first conductive material, and re-etching the first conductive material to part of a depth of the first openings;

depositing, in the first and second regions, a second insulating layer, etching, in the first region, second openings and, in the second region, third openings exposing source or drain regions of the transistors, and filling the second and third openings with a second conductive material;

depositing, in the first and second regions, a third insulating layer, etching, in the first region, fourth openings, and forming capacitors in the fourth openings; and etching, in the first and second regions, fifth openings respectively joining the second openings and the third openings, and filling the fifth openings with the second conductive material to form vias.

11. A method as defined in claim 10, wherein the fourth openings expose the first conductive material in the first openings and extend over gates of adjacent control transistors.

12. A method as defined in claim 10, wherein the protection layer over the gates of the control transistors forms an etch stop during etching of the fourth openings.

13. A method as defined in claim 10, wherein the second openings expose the first conductive material in the first openings.

14. A method as defined in claim 10, wherein the second openings expose source or drain regions of the control transistors.

15. A method as defined in claim 10, wherein forming capacitors comprises covering walls and bottoms of the fourth openings with a third conductive material to form a first capacitor electrode, depositing a dielectric material to form a capacitor insulator, and depositing a fourth conductive material to form a second capacitor electrode.

* * * * *